United States Patent
Vos

(10) Patent No.: US 8,730,673 B2
(45) Date of Patent: May 20, 2014

(54) FLUID-COOLED MODULE FOR INTEGRATED CIRCUIT DEVICES

(75) Inventor: David L. Vos, Apalachin, NY (US)

(73) Assignee: Lockheed Martin Corporation, Bethesda, MD (US)

( * ) Notice: Subject to any disclaimer, the term of this patent is extended or adjusted under 35 U.S.C. 154(b) by 164 days.

(21) Appl. No.: 13/354,531

(22) Filed: Jan. 20, 2012

(65) Prior Publication Data

US 2012/0300402 A1 Nov. 29, 2012

Related U.S. Application Data

(60) Provisional application No. 61/491,158, filed on May 27, 2011.

(51) Int. Cl.
*H05K 7/20* (2006.01)
*H01L 23/34* (2006.01)

(52) U.S. Cl.
USPC ........... 361/699; 361/701; 361/719; 257/686; 257/714

(58) Field of Classification Search
USPC ................... 361/701, 719; 174/252; 257/686, 257/714–715
See application file for complete search history.

(56) References Cited

U.S. PATENT DOCUMENTS

| | | | |
|---|---|---|---|
| 5,105,429 A | 4/1992 | Mundinger et al. | |
| 5,380,956 A * | 1/1995 | Loo et al. | 174/252 |
| 5,382,758 A | 1/1995 | Iacovangelo et al. | |
| 5,763,951 A | 6/1998 | Hamilton et al. | |
| 6,667,548 B2 | 12/2003 | O'Connor et al. | |
| 6,876,550 B2 | 4/2005 | Sri-Jayantha et al. | |
| 6,992,381 B2 | 1/2006 | Kim et al. | |
| 7,032,392 B2 | 4/2006 | Koeneman et al. | |
| 7,084,004 B2 | 8/2006 | Vaiyapuri et al. | |
| 7,084,495 B2 | 8/2006 | Kim et al. | |
| 7,294,926 B2 * | 11/2007 | Schubert et al. | 257/714 |
| 7,298,623 B1 * | 11/2007 | Kuczynski et al. | 361/719 |
| 7,335,972 B2 | 2/2008 | Chanchani | |
| 7,400,502 B2 * | 7/2008 | Hamman | 361/699 |
| 7,484,940 B2 | 2/2009 | O'Neill | |
| 7,592,697 B2 * | 9/2009 | Arana et al. | 257/714 |
| 7,679,916 B2 * | 3/2010 | Orr et al. | 361/719 |
| 7,696,015 B2 | 4/2010 | Kim et al. | |
| 7,763,973 B1 | 7/2010 | Bratkovskii et al. | |
| 7,823,403 B2 | 11/2010 | Sapir | |
| 7,832,096 B2 * | 11/2010 | Kuczynski et al. | 29/847 |
| 7,936,563 B2 * | 5/2011 | Gosset et al. | 361/689 |
| 8,110,415 B2 * | 2/2012 | Knickerbocker et al. | 438/15 |
| 2002/0163781 A1 * | 11/2002 | Bartola et al. | 361/699 |
| 2007/0153479 A1 | 7/2007 | Hamman | |

(Continued)

OTHER PUBLICATIONS

International Search Report and Written Opinion dated Aug. 31, 2012, in International Application No. PCT/US2012/039768.

(Continued)

*Primary Examiner* — Robert J Hoffberg
(74) *Attorney, Agent, or Firm* — Miles & Stockbridge P.C.

(57) ABSTRACT

A self-contained fluid-cooled electro-optical plug in type module capable of being exchangeably mounted in an external chassis incorporates electronic or electro-optical devices mounted on one or more interposers which provide electrical power and electric and optical signal connections to the devices and are also provided with fluid conduits through which a cooling fluid is circulated in a closed-loop cooling path to a heat exchanger for transferring the heat generated in the devices to external heat disposal equipment in the mounting chassis.

20 Claims, 10 Drawing Sheets

(56) References Cited

U.S. PATENT DOCUMENTS

| | | |
|---|---|---|
| 2009/0251862 A1 | 10/2009 | Knickerbocker et al. |
| 2010/0209854 A1 | 8/2010 | Betschon et al. |
| 2010/0290188 A1 | 11/2010 | Brunschwiler et al. |

OTHER PUBLICATIONS

King, Jr., Calvin R., et al., "Electrical and Fluidic C4 Interconnections for Inter-Layer Liquid Cooling of 3D IC's", Georgia Institute of Technology, Atlanta, GA, Jun. 1-4, 2010, pp. 1-8.

Kim, Yoon Jo, et al., "Thermal Characterization of Interlayer Microfluid Cooling of Three-Dimensional IC with Non-Uniform Heat Flux", Keynote Paper, Proceedings of the Seventh International ASME Conference on Nanochannels, Microchannels and Minichannels, ICNMM2009, Jun. 22-24, 2009, Pohang, South Korea, pp. 1-10.

Bakir, Muhannand et al., "Revolutionary NanoSilicone Ancillary Technologies for Ultimate-Performance Gigascale Systems", Microelectronics Research Center, Georgia Institute of Technology, Atlanta, GA, IEEE2007 Custom Integrated Circuits Conference, pp. 421-428.

Dang, Bing, "Integrated Microfluid Cooling and Interconnects for 2D and 3D Chips", IEEE Transactions on Advanced Packaging, vol. 33, No. 1, Feb. 2010, pp. 79-87.

\* cited by examiner

FLUID-COOLED MODULE FOR INTEGRATED CIRCUIT DEVICES

CROSS-REFERENCE TO RELATED APPLICATION

The present application claims the benefit of the priority of U.S. Provisional Application No. 61/491,158 filed May 27, 2011, the entirety of which is incorporated herein by reference.

BACKGROUND

The invention provides a modular assembly which may include integrated circuit devices and photonic devices, and includes a self-contained fluid cooling loop. The module is preferably configured to cooperate with an external chassis or backplane for electrical and photonic integration with other equipment, and to cooperate with external cooling apparatus in the external chassis. The module is especially useful for use with high-powered multi-chip electronic devices that require substantial cooling for proper operation. The working fluid may be a single phase liquid, a single phase vapor or gas, or a two-phase mixed flow medium.

The module typically incorporates a substrate, conventionally designated as a "printed wiring board" (PWB) that provides a base for mounting the components of the module and incorporates appropriate electrical wiring and any optical fiber paths for supplying the active components of the module with power and signals, electrical and optical, through a connector which mates with appropriate interfacial connectors in the mounting chassis.

The base PWB supports an assembly of active devices, such as electronic integrated circuits (ICs), electro-optical devices, and the like, along with appropriate fluid-cooled supporting structures for active devices requiring fluid cooling. The fluid-cooled supporting structures may take the form of one or more interposers containing electrical connections for ICs, and the like, mounted thereon, wherein the interposers incorporate channels through which fluid coolant can be circulated. The active devices mounted on the interposer are typically in thermal (heat transmissive) contact therewith to permit conductive transfer of heat generated within the active devices to the fluid-cooled interposer. In some embodiments of the invention, the active devices may incorporate channels, in fluid-transmissive communication with the channels in the interposer, for circulating cooling fluid through the active devices themselves. The PWB base also supports, or is supported on, a heat exchanger provided with channels for the fluid coolant, which communicate with the channels in the interposer and a small form factor fluid pump to provide a closed cooling loop, through which the coolant is circulated by the pump. The base PWB may also support other electronic or electro-optical devices, or the like, which do not require fluid cooling.

The heat exchanger can be configured to cooperate with cooling apparatus in the mounting chassis, into which the module of the invention is designed to be fitted or plugged, in order to dispose of heat extracted from the devices mounted in the module by transferring the heat to the external environment.

The external chassis that receives the module of the invention as a plug-in component may be any conventional equipment mounting chassis capable of providing the electrical, optical (if necessary), and thermal interfaces required to connect the module for cooperation with external apparatus. Such equipment mounting chassis are conventional in both fixed installations and mobile equipment, such as land vehicles, ships, aircraft, spacecraft, and the like.

The heat exchanger component of the module, in addition to the channels for circulating coolant, may also incorporate channels, fins, or the like, for heat transfer to a stream of cooling air provided by external equipment, e.g., by the mounting chassis. Alternatively, the heat exchanger component of the module may transfer heat to the next higher assembly by means of a conductive heat transfer interface.

In various embodiments of the module, multiple dies (or "chips") from any variety of commercial and/or military suppliers are mounted to an interposer comprising power, signal (electrical or photonic), and cooling interfaces. The "chips" technology suitable for incorporation in the fluid-cooled modules of the invention may include processors, graphics processors, digital signal processors (DSP), radio-frequency integrated circuits (RFIC), power amplifiers, and the like. The interposer and chips may also be contained within a volume protection technology which is in turn mounted to a printed wiring board with surface mount technology. The PWB may in turn be fixed to a heat exchanger incorporating channels or conduits for the cooling fluid. Fluid is exchanged between the interposer and the heat exchanger by means of a small pump integrated into the module. In one of numerous variations, a fluid-to-air heat exchanger is combined with the fluid-channel heat exchanger by incorporating an air-cooled heat exchanger therein. In certain embodiments of the invention, the heat exchanger may be fixed directly to an interposer, rather than to the base PWB. In certain embodiments of the invention, the heat exchanger may be incorporated within a lid or cover for a component of the module (e.g., a lower level assembly of the module such as a ball grid array (BGA) hybrid), rather than to the base PWB.

Accordingly, in one of its principal aspects, the present invention provides an electric or electro-optical module, comprising:

an electronic or electro-optical component mounted on an interposer; and a closed-loop fluid cooling path providing fluid communication to the heat exchanger from the interposer.

According to another of its principal the invention comprises a fluid-cooled electronic or electro-optical module, comprising:

an interposer having at least electrical circuitry and having at least one cooling fluid channel;

a micro-electronic or electro-optical device mounted on said interposer in heat transmissive contact therewith;

a heat exchanger; and a closed-loop fluid cooling path providing fluid communication exclusively between the heat exchanger and the interposer.

According to another of its principal aspects, the present invention provides an electric or electro-optical module, comprising:

an electronic or electro-optical component mounted on an interposer;

a closed-loop fluid cooling path providing fluid communication to a heat exchanger from the interposer;

a printed wiring board;

the interposer mounted on the printed wiring board;

the printed wiring board being mounted to the heat exchanger; and a pump mounted on the printed wiring board or the interposer in the fluid cooling path to circulate the fluid through the interposer and the heat exchanger.

The invention permits operation of electronic and electro-optical devices at substantially higher power densities as compared with modules provided only with convective cooling, forced air cooling, or the like. Thus, a typical module of the invention having a size of about 6 inches×4 inches×1 or 2 inches, can be capable of supporting devices having a total heat dissipation on the order of 300 to 500 watts, depending on heat rejection limitations of associated chassis equipment.

BRIEF DESCRIPTION OF THE DRAWINGS

The invention will be illustrated by the following drawings, which are to be considered as illustrative and not limiting.

DETAILED DESCRIPTION

Figure 1:
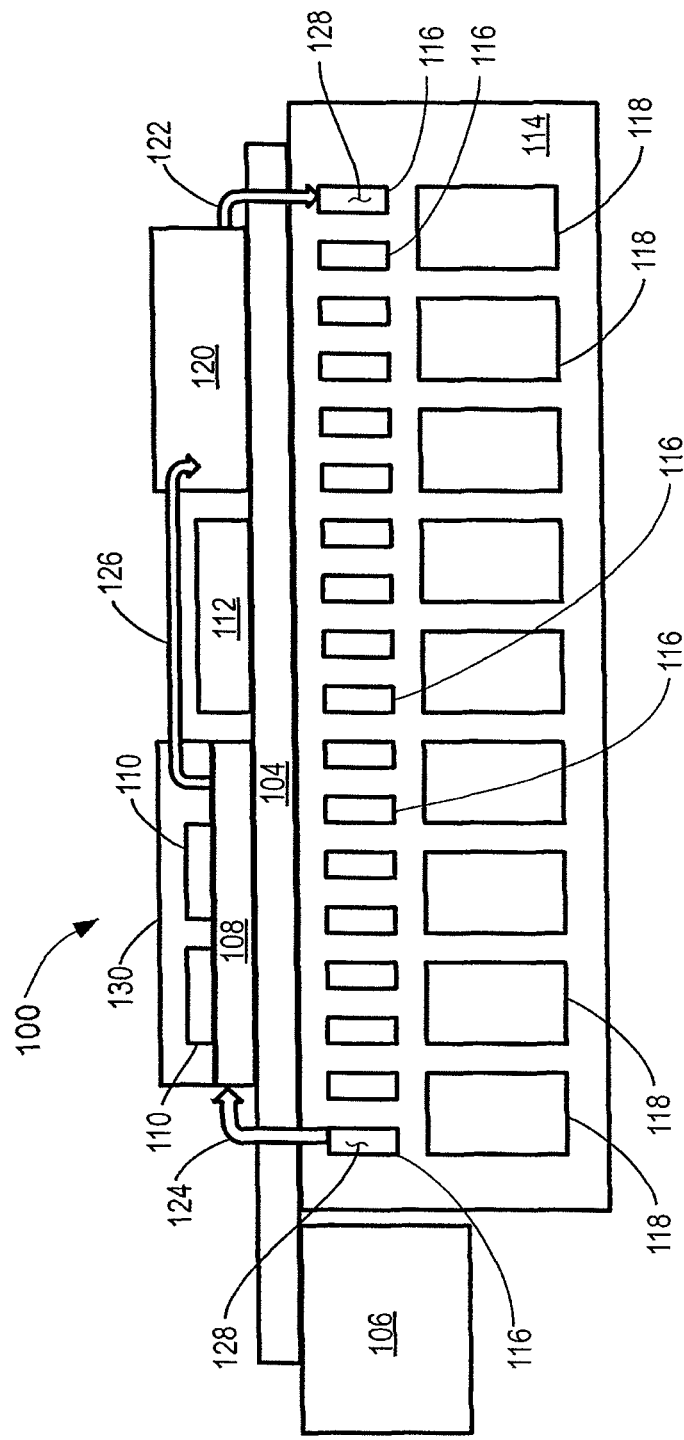
FIG. 1 shows a schematic side view of an embodiment of the fluid-cooled module of the invention.

As indicated above, the principal components of the self-contained fluid-cooled plug-in type module of the invention, designed to be interchangeably mounted in an external chassis that provides necessary services for operation of the module, e.g., electrical power, electrical and optical signal connections, and heat disposal apparatus may include:

a suitable base for uniting the elements into a module;

an electric or electro-optical connector for connecting the module to the services provided by the external chassis;

one or more interposers, typically mounted on the base, for accepting heat from electric, electronic, or electro-optical devices mounted thereon, and incorporating electrical circuitry, optionally one or more optical signal channels, and appropriate channels for circulating cooling fluid through the interposer;

one or more electronic or electro-optical devices mounted on the interposer and in heat-transmissive contact with the interposer, either by contact or by means of cooling fluid circulated through cooling channels with in the electronic or electro-optical devices;

a heat exchanger having channels for circulating a cooling fluid and being designed and configured to collaborate with heat disposal apparatus in the external chassis to transfer heat from the module to the external environment;

a pump for circulating the cooling fluid through the cooling fluid channels of the relevant elements of the module; and appropriate connecting conduits to provide a closed-loop fluid path or circuit through the pump and the channels in the various elements of the module.

The base element of the module is typically a generally conventional printed wiring board (PWB) configured with appropriate structure and hardware for supporting and securing the elements of the module. The PWB will also typically be provided with generally conventional power and signal connections for the devices mounted thereon, e.g., electrical power circuitry for supplying power to the active elements of the module, as well as electric and optionally optical signal channels, such as wiring, waveguides, fiber optic guides, and the like. The PWB can be constructed of generally conventional material, e.g., synthetic polymers, fiber-reinforced polymers, ceramics, or the like, and can be manufactured by generally conventional techniques. The PWB base incorporated in the fluid-cooled module of the invention may also incorporate channels for interconnecting the fluid-conducting channels in the devices mounted thereon The electric or electro-optical connector for connecting the module to the services provided by the external chassis incorporates generally conventional electrical and/or electro-optical connectors for interfacing with mating connectors in the external chassis. The electric or electro-optical connector can be mounted on the PWB base and integrated with the internal power and signal channels of the PWB by conventional procedures.

The interposers provide electrical and/or optical connections from the devices mounted thereon to the electric circuitry and optical signal channels of the PWB, and also may provide electrical and optical interconnections between the devices. The interposers also provide the conventional function of conducting heat away from the devices mounted thereon. In the fluid-cooled module of the invention the interposers are also provided with channels for circulation of cooling fluid therethrough to transfer heat from the interposer to the heat exchanger for ultimate disposal to the environment. Certain interposers of such design are known and can be constructed or otherwise obtained.

The electronic or electro-optical devices to be integrated into the fluid-cooled module of the invention may be any conventional device that can be usefully and readily incorporated into relatively compact plug-in type module to provide convenient installation of such equipment as well as, replacement, servicing, upgrading, repair, and the like, thereof. As indicated above, such devices may include processors, such as microprocessors, graphics processors, digital signal processors (DSP), radio-frequency integrated circuits (RFIC), memory chips, power amplifiers, radio and/or optical transmitters and/or receivers, and the like. Such devices may be mounted on the interposer by any conventional procedure, e.g., by ball grid array technology. In order to provide optimum heat transfer from the device to the interposer, the devices may be mounted with surfaces thereof in contact with a surface of the interposer, or in close proximity to the interposer surface with the use of filling materials to enhance thermal contact and lower thermal resistance, such as heat-conductive pastes, and the like. In the fluid-cooled module of the invention, the devices integrated therein may themselves be provided with cooling channels, e.g., internal channels, for cooling fluid. These cooling channels in the devices are configured to communicate with corresponding fluid channels in the interposer to provide a flow of cooling fluid directly in contact with the devices mounted on the interposer.

In certain embodiments of the invention two or more of the electronic or electro-optical devices may be superimposed on one another, to form a stack or superimposed configuration, in order to provide efficient electric or optical interconnections therebetween. In such embodiments, appropriate arrangements of interposers, heat exchangers, and conduits for circulating cooling fluid can be provided to assure suitable cooling of the electronic and electro-optical devices. Such arrangements are within the capability of the skilled practitioner, and illustrative examples of such arrangements are shown in the drawings and discussed below.

The heat exchanger integrated into the fluid-cooled module of the invention is of generally conventional design, containing internal channels for circulation of cooling fluid therethrough. The fluid channels of the heat exchanger communicate with the channels in the interposer or other devices to provide for circulation of cooling fluid from the heat-generating devices of the module through the heat exchanger to transfer the heat to the exchanger for ultimate disposal to the environment. Heat may be transferred from the heat exchanger of the fluid-cooled module of the invention to the external environment using any conventional apparatus or procedure. Thus, in order to transfer heat from the heat exchange of the fluid-cooled module to cooling equipment in the external chassis, the heat exchanger may be provided with internal ducts for passage of air or other cooling gas provided by the external chassis. The air or gas so provided is then returned to the external chassis for further transfer to heat sinks in the external environment. Alternatively, an appropriate arrangement of fins on the heat exchanger can provide heat transfer surface for contact with an external supply of air or other cooling gas. Alternatively, the heat exchanger of the fluid-cooled module may have an external surface designed and configured to interface directly with cooling apparatus in the external chassis. Such apparatus may include a surface for receiving heat from the fluid-cooled module by conduction, or may involve apparatus for contacting the heat transfer surface of the module heat exchanger with an externally supplied liquid cooling medium, or the like.

The pump for circulating the cooling fluid through the closed-loop circuit used in the fluid-cooled module of the invention may be any pump of a size and capacity for mounting within the module of the invention and providing a sufficient rate of flow through the closed cooling loop. The pump may be mounted on the PWB base or on an interposer that also supports one or more of the devices incorporated into the module. Fluid-transmissive channels, either formed within the devices of the module or provided by appropriate connecting tubing, conduct the cooling fluid through the closed cooling loop from the outlet of the pump through the various fluid channels in the interposers, heat exchanger, devices, and/or PWB and back to the pump inlet. As indicated above, the working fluid for the closed-loop cooling circuit may be a single-phase liquid, a single-phase vapor or gas, or a two-phase mixed flow medium.

Figure 10:
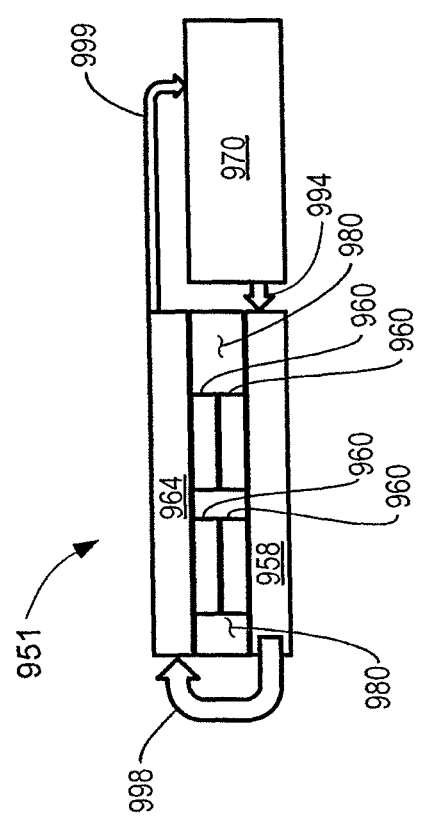
FIG. 10 shows a schematic side view of a tenth embodiment of the fluid-cooled module of the invention.

In various embodiments of the invention, the components of the module may be mounted and interconnected in different arrangements, provided that a closed-loop cooling path is provided between the heat exchanger and the one or more interposers. It is not excluded that, in certain embodiments, the PWB base may omitted, and the interposers and electronic and/or electronic devices mounted on the interposers may be supported on, or mechanically connected to, other components of the module, e.g., to the heat exchanger. Such an embodiment is schematically illustrated in FIG. 10, discussed below. In such embodiments the electrical and/or optical connections between the self-contained fluid-cooled module and the external chassis into which it is mounted may be provided by appropriate connectors and interfaces mounted or supported on the structures of the module, e.g., on the heat exchange or an interposer.

Thus, the invention also includes a method for cooling an integrated circuit device, comprising:

providing a module comprising:
an interposer having at least one cooling fluid channel;
a heat exchanger; and
a closed-loop fluid cooling path providing fluid communication to the
heat exchanger from the interposer;
providing an integrated circuit device on the interposer in heat transmissive contact with the interposer; and
circulating a cooling fluid through the closed-loop fluid cooling path.

The integrated circuit device may have at least one internal cooling fluid channel in fluid communication with said cooling fluid channel in said interposer.

In the method of the invention, the cooling fluid may be circulated at a rate sufficient to provide a heat dissipation of at least about 300 watts.

Exemplary embodiments of the invention are schematically illustrated in the following figures.

FIG. 1 illustrates a fluid-cooled module 100 that constitutes one embodiment of the invention.

The fluid-cooled module 100 has an electrical or electro-optical printed wiring board 104 that serves as a base for mounting various components of the module. The printed wiring board (PWB) 104 is provided with conventional electric power and signal circuitry, and optionally with optical components such as fiber optic data transmission lines, that convey the electrical and optical signals from electronic and optical elements of the module to an electro-optical connector 106, which provides an interface with a chassis or other external mounting equipment (not shown) for supplying electrical power to the module and transmitting the signals to associated equipment, such as computer, displays, communication equipment, radar equipment, and the like.

An interposer 108 is mounted on the printed wiring board 104 and provides electrical and/or optical connections between electronic and/or optical devices mounted on the interposer 108, such as, e.g., integrated circuit chips 110. Some or all of the IC devices 110 are typically in thermal contact with the interposer 108 for conductive transfer of heat from the IC devices to the interposer. The interposer 108 is also provided with internal channels for conveying a heat transfer fluid 128 through the interposer 108. The internal fluid conduit channels of the interposer are connected to fluid conduits 124 and 126 that convey the heat transfer fluid 128 from a heat exchanger 114 to the interposer 108 and from the interposer 108 to a pump 120 for circulating the heat transfer fluid 128 through the interposer 108 and heat exchanger 114. The pump 120 may also mounted on the printed wiring board 104, and is connected to the internal fluid channels 116 of the heat exchanger 114 by a fluid conduit 122. It will be understood that the fluid conduits 122, 124, and 126 are shown schematically, to illustrate the circulation of the heat transfer fluid 128; they may be separate conduits, as shown, or may be integrated into the printed wiring board 104.

The heat exchanger 114 may also have internal ducts 118 for channeling cooling streams of air, provided from external equipment, through the heat exchanger 114 and to ducts provided in the mounting chassis (not shown) for ultimate delivery of the removed heat to the environment. Alternatively, in the module 100 and in other embodiments of the self-contained fluid-cooled module of the invention, as described below, the heat exchanger may be provided with external fins, or the like (not shown), to supplement or replace the internal cooling ducts 118, for transfer of heat to appropriate heat disposal apparatus provided in the mounting chassis.

The printed wiring board 104 may also serve as a support for other electronic or optical devices that do not require the intensive cooling provided by the circulation of heat transfer fluid 128. Such a device 112 is shown schematically, and may be mounted on the printed wiring board 104 by conventional methods, such as, e.g., a ball grid array.

Those elements of the module 100 that may benefit from special protection from the environment can be positioned within a protective volume 130, e.g., by encapsulation or other conventional protective structures.

It will be appreciated by those skilled in the art that the various elements that are combined to form the self-contained fluid-cooled plug-in type electrical or electro-optical module 100 of the invention are themselves known and conventional, and can be selected and obtained from commercial sources or readily constructed by conventional techniques.

A self-contained fluid-cooled plug-in module of the type shown in FIG. 1, when implemented in a typical package measuring about 6 in ×4 in ×1.2 in, can weigh about 1.2 lb and be capable of handling electronic and electro-optical devices requiring heat dissipation up to about 300 watts of power while providing adequate cooling of such devices.

Figure 2:
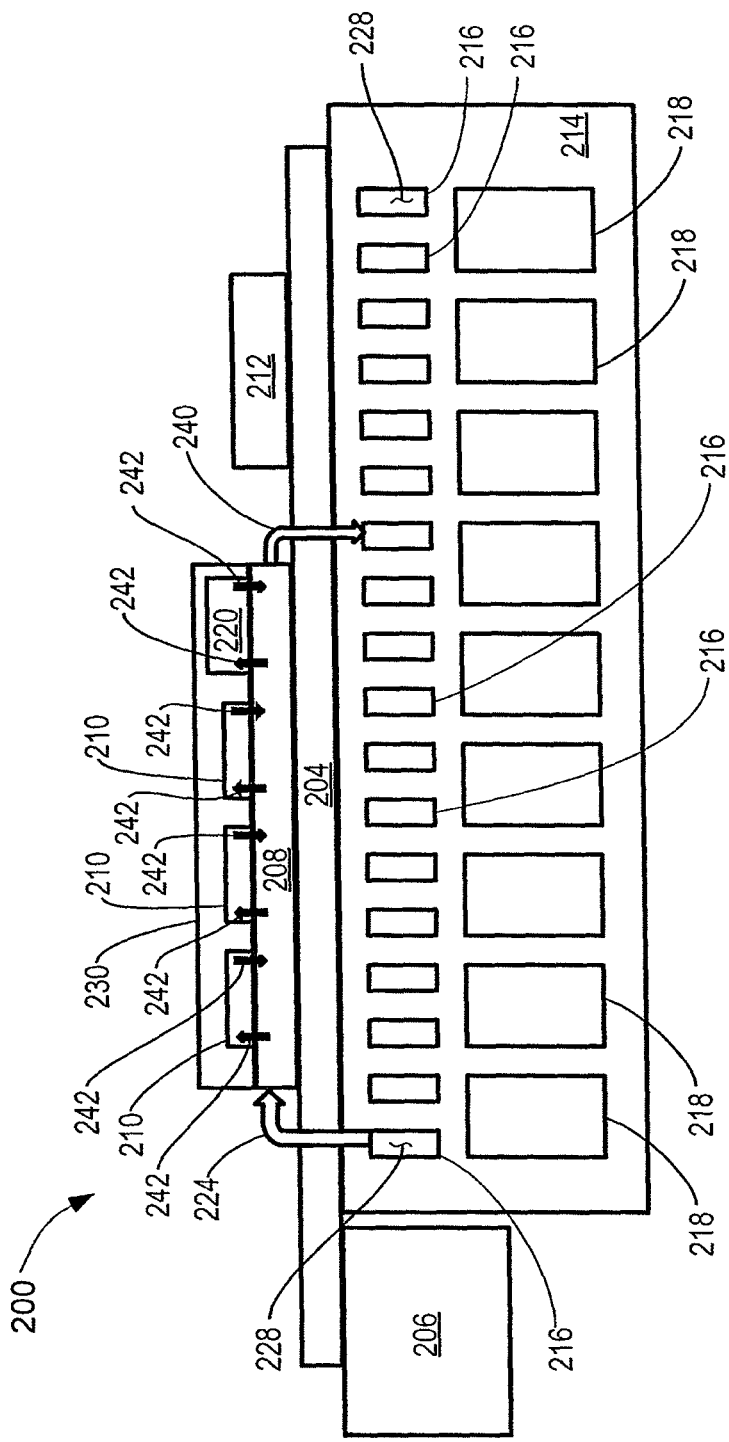
FIG. 2 shows a schematic side view of a second embodiment of the fluid-cooled module of the invention.

FIG. 2 illustrates an embodiment of the fluid-cooled module 200 of the invention, similar to the module 100 of FIG. 1, wherein heat transfer fluid is additionally circulated through channels in electronic or electro-optical ICs 210, and a pump 220 is provided directly mounted on an interposer 208.

The fluid-cooled module 200 has a printed wiring board 204 that serves as a base for mounting various components of the module. The printed wiring board 204 is provided with conventional electric power and signal circuitry and optionally with optical components such as fiber optic data transmission lines that convey the electrical and optical signals from electronic and optical elements of the module to an electro-optical connector 206, which provides an interface with a chassis or other external mounting equipment (not shown) for supplying electrical power to the module and transmitting the signals to associated equipment, such as computer, displays, communication equipment, radar equipment, and the like.

The interposer 208 is mounted on the printed wiring board 204 and provides electrical and/or optical connections between electronic and/or optical devices mounted on the interposer 208, such as, e.g., integrated circuit chips 210. Some or all of the IC devices 210 are typically in thermal contact with the interposer 208 for conductive transfer of heat from the IC devices to the interposer. The interposer 208 is also provided with internal channels for conveying a heat transfer fluid 228 through the interposer 208. The internal fluid conduit channels of the interposer 208 are connected to fluid conduits 224 and 240 that, respectively, convey the heat transfer fluid 228 from a heat exchanger 214 to the interposer 208 and from the interposer 208 to the channels 216 of the heat exchanger 214. It will be understood that the fluid conduits are shown schematically, to illustrate the circulation of the heat transfer fluid 228; they may be separate conduits, as shown, or may be integrated into the printed wiring board 204. The pump 220 communicates with fluid conduits internal to the interposer, as indicated schematically by arrows 242, in circulating the heat transfer fluid 228. In this embodiment of the invention, some, or all, of the IC devices 210 may be provided with internal channels through which heat transfer fluid 228 may flow from interposer 208 and back into the interposer 208 as indicated by arrows 242.

The heat exchanger 214 may also have internal ducts 218 for channeling cooling streams of air, provided from external equipment, through the heat exchanger and to ducts provided in the mounting chassis for ultimate delivery of the removed heat to the environment.

The printed wiring board 204 may also serve as a support for other electronic or optical devices that do not require the intensive cooling provided by the circulation of heat transfer fluid 228. Such a device 212 is shown schematically, and may be mounted on the printed wiring board 204 by conventional methods, such as, e.g., a ball grid array.

Those elements of the module 200 that may benefit from special protection from the environment can be positioned within a protective volume 230, e.g., by encapsulation or other conventional protective structures.

It will be appreciated by those skilled in the art that the various elements that are combined to form the self-contained fluid-cooled plug-in type module 200 of the invention are themselves known and conventional, and can be selected and obtained from commercial sources or readily constructed by conventional techniques.

A self-contained fluid-cooled plug-in type module of the type shown in FIG. 2, when implemented in a typical package measuring about 3 in ×2 in ×1 in, can weigh about 0.75 lb and be capable of handling electronic and electro-optical devices requiring heat dissipation up to about 500 watts of power while providing adequate cooling of such devices.

Figure 3:
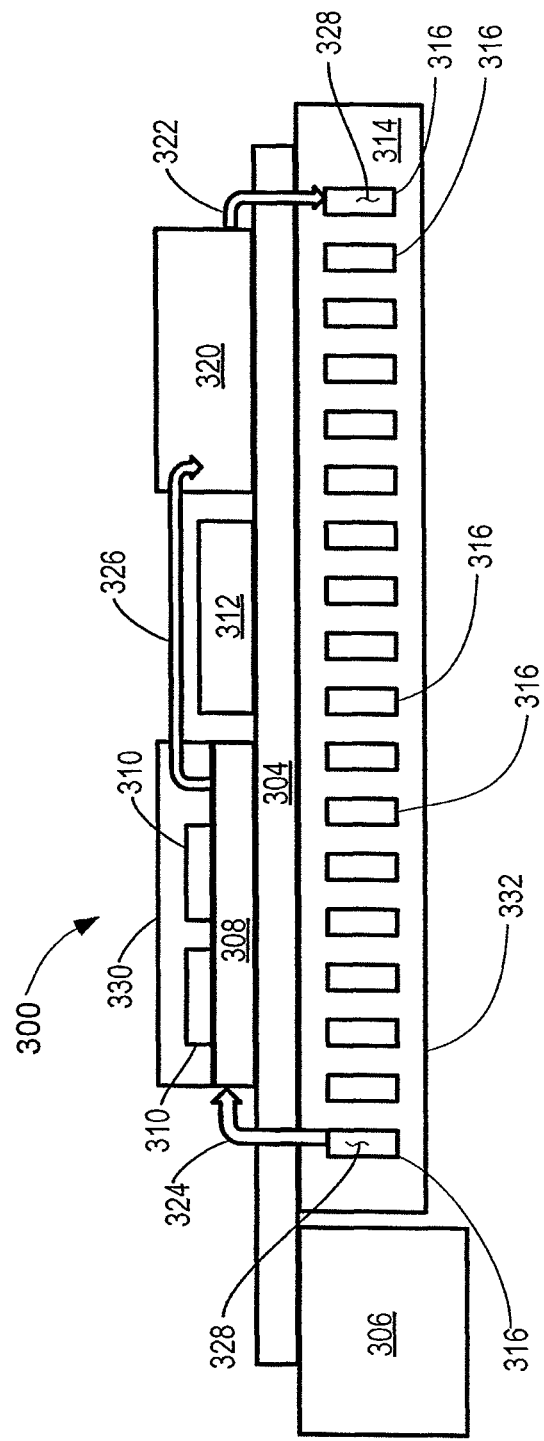
FIG. 3 shows a schematic side view of a third embodiment of the fluid-cooled module of the invention.

FIG. 3 illustrates a third embodiment 300 of the fluid-cooled module of the invention, which is generally similar to the embodiment of FIG. 1, but wherein the heat exchanger 314 instead of having internal ducts for cooling air, is provided with a surface 332 which can be placed in contact with a heat transfer medium, e.g., a cold plate surface, that is provided by the mounting chassis. Note that the cold plate geometry is not defined or constrained by this illustration.

The fluid-cooled module 300 is has a printed wiring board 304 that serves as a base for mounting the various components of the module. The printed wiring board 304 is provided with conventional electric power and signal circuitry and optionally with optical components, such as fiber optic data transmission lines, that convey electric power, electrical signals, and optical signals to and from the electronic and optical elements of the module via an electro-optical connector 306, which provides an interface with a chassis or other external mounting equipment (not shown) for supplying electrical power to the module and transmitting signals to associated external equipment such as computers, displays, communication equipment, radar equipment, and the like.

An interposer 308 is mounted on the printed wiring board 304 and provides electrical and/or optical connections between electronic or optical devices mounted on the interposer 308, such as, e.g., integrated circuit chips 310. Some or all of the IC devices 310 are typically in thermal contact with the interposer 308 for conductive transfer of heat from the IC devices to the interposer. The interposer 308 is also provided with internal channels for conveying a heat transfer fluid 328 through the interposer 308. The internal fluid conduits of interposer 308 are connected to fluid conduits 324 and 326 that convey the heat transfer fluid 328 from a heat exchanger 314 to the interposer 308 and from the interposer 308 to a pump 320 for circulating the heat transfer fluid 328 through the interposer 308 and heat exchanger 314. The pump 320 may be mounted on the printed wiring board 304 and connected to the internal fluid channels 316 of the heat exchanger 314 by a fluid conduit 322. The pump 320 may receive electrical power and control signals through the circuitry of the printed wiring board 304. It will be understood that conduits 322, 324, and 326 are shown schematically, to illustrate the circulation of the heat transfer fluid 308; they may be separate conduits, as shown, or may be integrated into the printed wiring board 304.

As indicated above, the heat exchanger 304 has a surface 332 through which heat can be transferred to an external heat exchanger, mounted in the external mounting chassis (not shown) for further transfer by conduction or convection to the environment.

The printed wiring board 304 may also serve as a support for other electronic or optical devices that do not require the intensive cooling provided by the circulation of heat transfer fluid 328. Such a device 312 is shown schematically, and may be mounted on the printed wiring board 304 by conventional methods, such as, e.g., a ball grid array.

Those elements of the module 300 that may benefit from special protection from the environment can be positioned within a protective volume 330, e.g., by encapsulation or other conventional protective enclosing structures.

As in the other embodiments of the self-contained fluid-cooled plug-in module of the invention, the components integrated in the module 300 are themselves known and conventional, and can be selected and obtained from commercial sources or readily constructed by conventional techniques.

A self-contained fluid-cooled plug-in type module of the invention such as module 300, when implemented in a typical package measuring about 6 in ×4 in ×0.8 in, can weigh about 0.8 lb and be capable of handling electronic and electro-optical devices requiring heat dissipation up to about 400 watts of power while providing adequate cooling of such devices.

Figure 4:
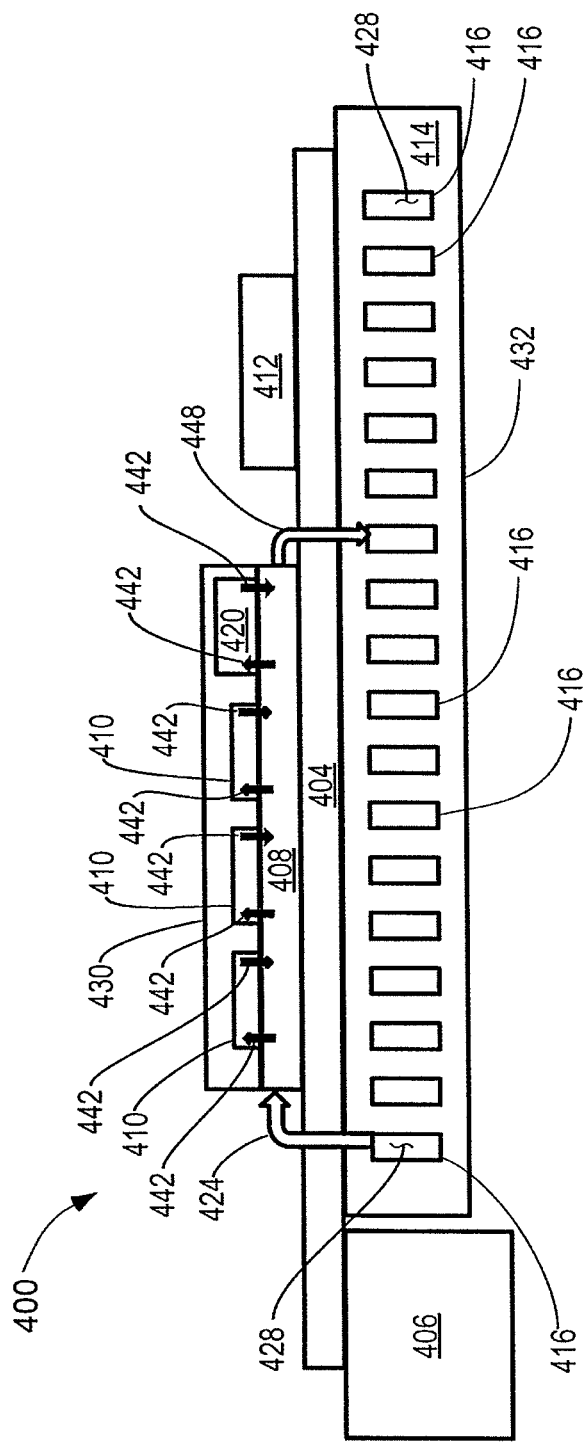
FIG. 4 shows a schematic side view of a fourth embodiment of the fluid-cooled module of the invention.

FIG. 4 illustrates another embodiment 400 of the self-contained fluid-cooled plug-in type module of the invention. The module 400 is generally similar to the module 200 of FIG. 2 but differs from the module 200 in that the heat exchanger 414, instead of having internal ducts for cooling air streams, has an external surface 432 that can contact an external heat exchanger, mounted in the chassis into which the module 400 is inserted or plugged, in order to carry the heat away from the module and dispose of it into the environment.

Accordingly, the module 400 has a printed wiring board 404 that serves as a base for mounting the various components of the module. The printed wiring board 404 is provided with conventional electric circuitry and optionally with optical components, such as fiber optic data transmission lines, which convey electric power, electrical signals, and optical signals to and from the electronic and optical elements of the module via an electro-optical connector 406, which provides an interface with a chassis or other external mounting equipment (not shown) for supplying electrical power to the module and transmitting signals to associated external equipment such as computers, displays, communication equipment radar equipment, and the like.

As in the modules illustrated in FIGS. 1-3, the module 400 includes an interposer 408 having internal channels for heat transfer fluid 428, and having electrical or optical integrated circuit chips 410, mounted thereon. Some or all of the IC devices 410 are typically in thermal contact with the interposer 408 for conductive transfer of heat from the IC devices to the interposer. The module 400 includes a pump 420 for circulating the heat transfer fluid through the channels of the interposer 408, the conduit 440, the channels 416 of the heat exchanger 414, and conduit 424 back to the interposer 408. It will be understood that the fluid conduits 424 and 448 are shown schematically, to illustrate the circulation of the heat transfer fluid 428; they may be separate conduits, as shown, or may be integrated, at least partially, into the printed wiring board 404. Some or all of the IC devices 410 may be provided with internal channels through which the cooling fluid 428 may be circulated for more efficient cooling. These internal channels are connected to corresponding channels with in the interposer 408 for circulation of heat transfer fluid 428 as indicated by arrows 442. As in the embodiment of FIG. 2, the pump 420 is mounted directly on the interposer 408, and also communicates with the internal fluid channels of the interposer 408 in circulating the heat transfer fluid 428, as indicated by arrows 442.

As in the embodiment of FIG. 3, the heat exchanger 414 has a surface 432 through which heat can be transferred to an external heat exchanger, mounted in the chassis, for further transfer by conduction or convection to the environment.

The printed wiring board 404 may also serve as a support for other electronic or optical devices that do not require the intensive cooling provided by the circulation of heat transfer fluid 428. Such a device 412 is shown schematically, and may be mounted on the printed wiring board 404 by conventional methods, such as, e.g., a ball grid array.

As in previously described modules, those elements of the module 400 that may benefit from special protection from the environment can be positioned within a protective volume 430, e.g., by encapsulation or other conventional protective enclosing structures. In the module 400, the pump 420 is also included within the protective volume 430, and is mounted on the interposer 408.

As in the other embodiments of the self-contained fluid-cooled plug-in type module of the invention, the components integrated in the module 400 are themselves known and conventional, and can be selected and obtained from commercial sources or readily constructed by conventional techniques.

A self-contained fluid-cooled plug-in type module of the invention such as module 400, when implemented in a typical package measuring about 3 in ×2 in ×0.75 in, can weigh about 0.5 lb and be capable of handling electronic and electro-optical devices requiring heat dissipation up to about 500 watts of power while providing adequate cooling of such devices.

FIGS. 1-4 illustrate embodiments of the invention wherein the heat exchanger is mounted directly on the printed wiring board. In the embodiments illustrated in the following figures the heat exchanger is ultimately mounted or supported on the printed wiring board, but is positioned in contact with interposers and/or integrated circuit devices mounted between the printed wiring board and the heat exchanger, as described more fully below.

Figure 5:
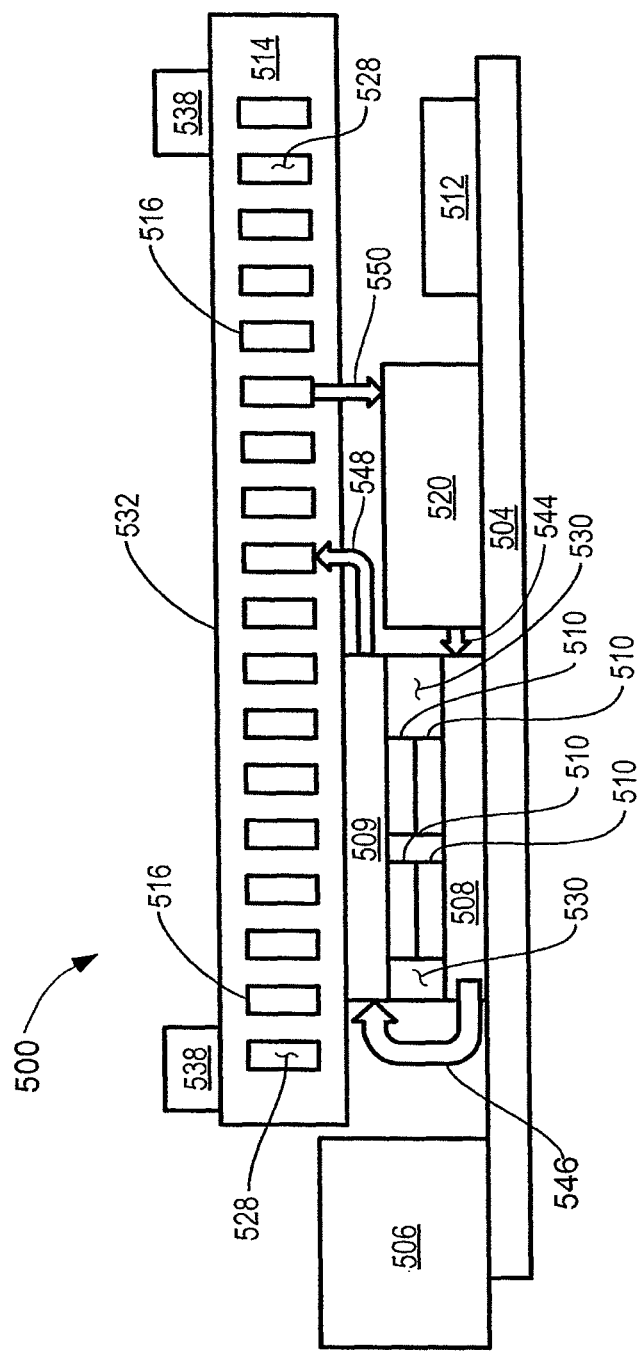
FIG. 5 shows a schematic side view of a fifth embodiment of the fluid-cooled module of the invention.

FIG. 5 illustrates another self-contained fluid-cooled plug-in type module 500 of the invention, configured to provide efficient cooling of electronic devices wherein IC chips are stacked for more efficient use of space and more direct connectivity.

The module 500 contains a printed wiring board 504 that serves as a base for mounting the various components of the module. As in other embodiments of the invention, the wiring board 504 is provided with conventional electric circuitry and optionally with optical components, such as fiber optic data transmission lines, that convey electric power, electrical signals, and optical signals to and from the electronic and optical elements of the module via an electro-optical connector 506, which provides an interface with a chassis or external other mounting equipment (not shown) for supplying electrical power to the module and transmitting signals to associated external equipment such as computers, displays, communication equipment radar equipment, and the like.

The module 500 contains two interposers 508 and 509. Stacked IC devices 510 are positioned between the interposers 508 and 509 for efficient heat transfer. The interposers 508 and 509 provide the electrical and optical connections to the IC devices and are typically in thermal contact with the IC devices 510 to remove heat from them by conduction. The interposers 508 and 509 are provided with internal channels for conveying a heat transfer fluid 528 through the interposers. The internal fluid conduits of interposers 508 and 509 are connected to external fluid conduits 544, 546, and 548, which, respectively, convey the heat transfer fluid 528 from a pump 520 to the interposers, between the interposers, and from the interposers to the channels 516 of heat exchanger 514. A fluid conduit 550 conveys the heat transfer fluid 528 from the heat exchanger 514 back to the pump 520. Note that FIG. 5 is illustrative only—additional layers or juxtaposition of layers of interposers and IC devices can be stacked and the embodiment is not limited to the two layers in the illustration.

In the module 500 the pump 520 may be mounted on the printed wiring board 504 and may receive electrical power and control signals through the circuitry of the printed wiring board 504. It will be understood that the conduits 544, 546, 548 and 550 are shown schematically, to illustrate the circulation of the heat transfer fluid 528; they may be separate conduits, as shown, or may be integrated, as appropriate, into the printed wiring board 504.

In the module 500 the heat exchanger 514 has a surface 532 through which heat can be transferred to an external heat exchanger, mounted in the chassis, for further transfer by conduction or convection to the environment. The module 500 is also provided with schematically indicated locking devices 538 for securing the module in its mounting chassis within a vehicle, or the like.

The printed wiring board 504 may also serve as a support for other electronic or optical devices that do not require the intensive cooling provided by the circulation of heat transfer fluid 528. Such a device 512 is shown schematically, and may be mounted on the printed wiring board 504 by conventional methods, such as, e.g., a ball grid array.

Those elements of the module 500 that may benefit from special protection from the environment can be positioned within a protective volume 530, e.g., by encapsulation or other conventional protective enclosing structures, which may be integrated with the interposers 508 and 509 as shown.

As in the other embodiments of the self-contained fluid-cooled plug-in type module of the invention, the components integrated in the module 500 are themselves known and conventional, and can be selected and obtained from commercial sources or readily constructed by conventional techniques.

A self-contained fluid-cooled plug-in type module of the type shown in FIG. 5, when implemented in a typical package measuring about 6 in ×4 in ×1 in, can weigh about 1.0 lb and be capable of handling electronic and electro-optical devices requiring heat dissipation up to about 450 watts of power while providing adequate cooling of such devices.

Figure 6:
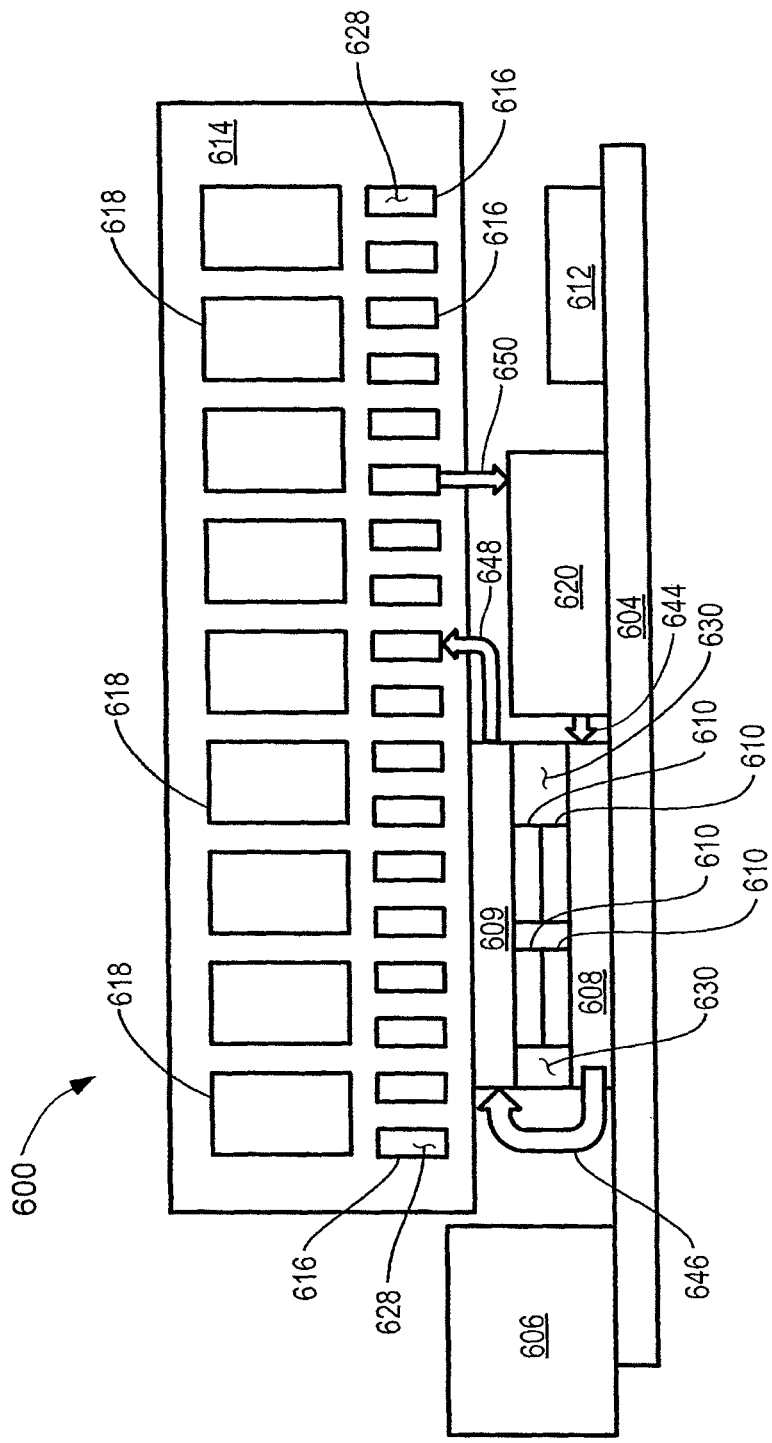
FIG. 6 shows a schematic side view of a sixth embodiment of the fluid-cooled module of the invention.

FIG. 6 illustrates another self-contained fluid-cooled plug-in type module 600 of the invention, which is similar to the module 500 of FIG. 5, but includes air ducts 618 in its heat exchanger 614 for transfer of heat from the module 600 to the environment through heat transfer equipment in the mounting chassis into which the module is plugged.

Thus, in the module 600, the printed wiring board 604, the electro-optical connector 606, the interposers 608, 609, the IC devices 610, the fluid conduits 644, 646, and 648, the pump 620, and other electric and/or optical devices 612 are mounted and function generally as described for corresponding elements of module 500 shown in FIG. 5.

The module 600 contains two interposers 608 and 609. Stacked IC devices 610 are positioned between the interposers 608 and 609 for efficient heat transfer. The interposers 608 and 609 provide the electrical and optical connections to the IC devices and are typically in thermal contact with the IC devices 610 to remove heat from them by conduction. The interposers 608 and 609 are provided with internal channels for conveying a heat transfer fluid 628 through the interposers. The internal fluid conduits of interposer 608 and 609 are connected to external fluid conduits 644, 646, and 648, which, respectively, convey the heat transfer fluid 628 from pump 620 to the interposers, between the interposers, and from the interposers to the channels 616 of heat exchanger 614. A fluid conduit 650 conveys the heat transfer fluid 628 from the heat exchanger 614 back to the pump 620. Note that FIG. 6 is illustrative only—additional layers or juxtaposition of layers of interposers and IC devices can be stacked and the embodiment is not limited to the two layers in the illustration.

In the module 600 the pump 620 may be mounted on the printed wiring board 604, and may receive electrical power and control signals through the circuitry of the printed wiring board 604. It will be understood that the conduits 644, 646, and 648 and 650 are shown schematically, to illustrate the circulation of the heat transfer fluid 628; they may be separate conduits, as shown, or may be integrated, at least in part, into the printed wiring board 604.

In the module 600, heat exchanger 614 may also have internal ducts 618 for channeling cooling streams of air, provided from external equipment, through the mounting chassis for ultimate delivery of the removed heat to the environment.

The printed wiring board 604 may also serve as a support for other electronic or optical devices that do not require the intensive cooling provided by the circulation of heat transfer fluid 628. Such a device 612 is shown schematically, and may be mounted on the printed wiring board 604 by conventional methods, such as, e.g., a ball grid array.

Those elements of the module 600 that may benefit from special protection from the environment can be positioned within a protective volume 630, e.g., by encapsulation or other conventional protective enclosing structures, which may be integrated with the interposers 608 and 609 as shown.

As in the other embodiments of the self-contained fluid-cooled plug-in type module of the invention, the components integrated in the module 600 are themselves known and conventional, and can be selected and obtained from commercial sources or readily constructed by conventional techniques.

A self-contained fluid-cooled plug-in module of the type shown in FIG. 6, when implemented in a typical package measuring about 6 in ×4 in ×1.2 in, can weigh about 1.2 lb and be capable of handling electronic and electro-optical devices requiring heat dissipation of up to about 340 watts of power while providing adequate cooling of such devices.

Figure 7:
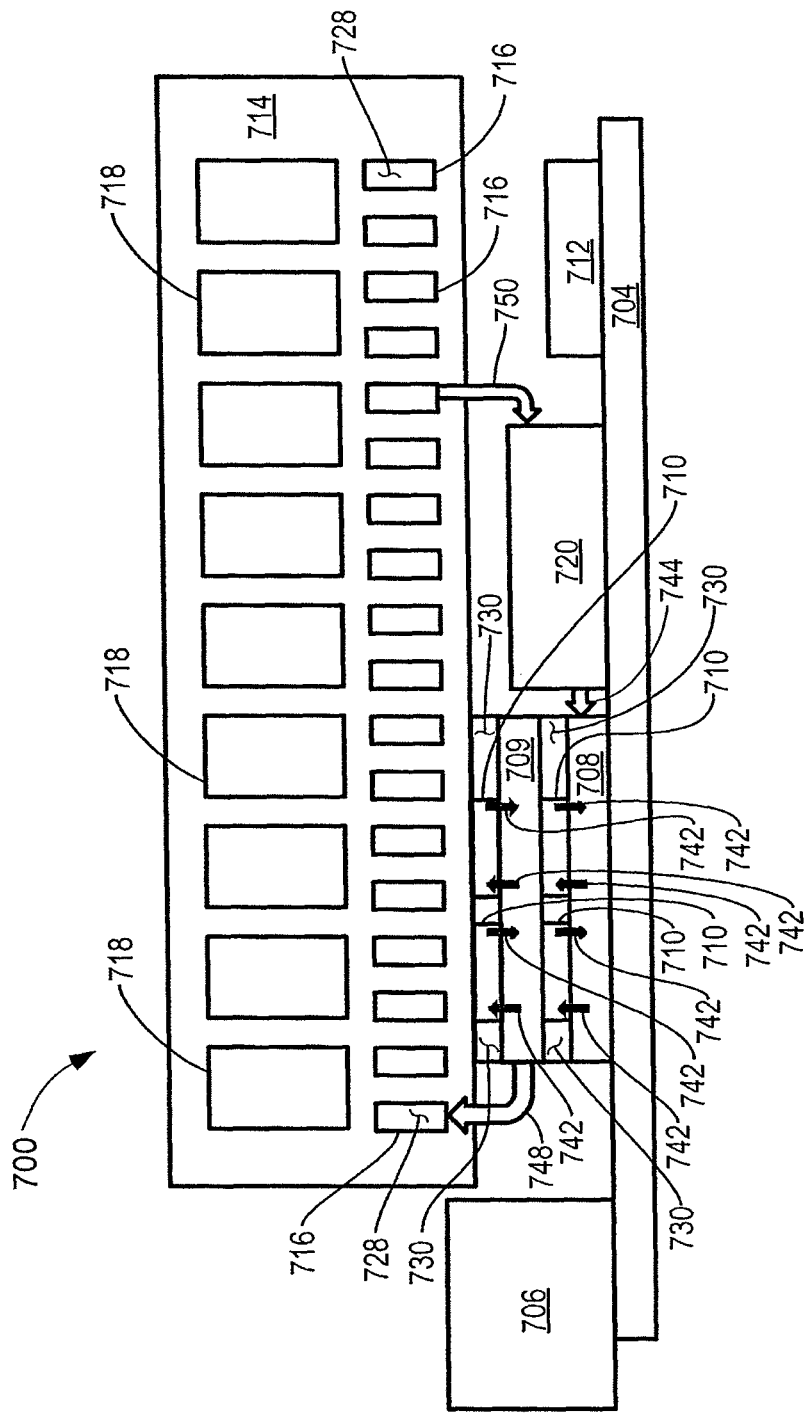
FIG. 7 shows a schematic side view of a seventh embodiment of the fluid-cooled module of the invention.

FIG. 7 illustrates another self-contained fluid-cooled plug-in type module 700 of the invention, wherein two levels of IC devices 710 and two interposers 708, 709 are stacked alternately between a PWB 704 and a heat exchanger 714.

In the module 700, the PWB substrate 704 may contain the power and signal (electronic and photonic) circuitry that is connected to the electro-optical connector 706 which interfaces with external circuitry and power supply facilities in the external mounting chassis. As in other embodiments of the invention, the PWB 704 may also support other electronic and/or electro-optical devices 712 that do not require fluid cooling.

The module 700 contains at least two interposers 708 and 709. IC devices 710 are positioned in two levels, between the interposers 708 and 709, and between interposer 709 and heat exchanger 714, for efficient conductive heat transfer. The interposers 708 and 709 are provided with electrical power, signal (electrical and/or optical) interfaces, and internal channels for conveying the cooling fluid 728. A pump 720, mounted on the PWB 704 circulates the heat transfer fluid 728 through, respectively, conduit 744, the interposers 708, 709, conduit 748, the fluid channels 716 of the heat exchanger 714, and conduit 750, back to the inlet of pump 720. The interposers 708, 709 also include channels for supplying heat transfer fluid 728 to the IC chips 710, some or all of which may be provided with internal channels through which the cooling fluid 728 may be circulated for more efficient cooling. These internal channels are connected to corresponding channels within the interposers 708, 709 for circulation of heat transfer fluid 728 as indicated by arrows 742. In this embodiment, wherein at least one level of IC devices is confined between a minimum of two adjacent interposers 708, 709, the IC devices of that level are provided with through channels, not specifically indicated, that permit transfer of heating fluid 728 from the first interposer 708 to the second interposer 709, as part of the fluid circulation.

In this embodiment, the heat exchanger 714 is provided with cooling air ducts 718 to transfer the rejected heat to the environment.

Those elements of the module 700 that may benefit from special protection from the environment can be positioned within a protective volume 730, e.g., by encapsulation or other conventional protective enclosing structures, which may be integrated with the interposers 708 and 709 as shown.

As in the other embodiments of the self-contained fluid-cooled plug-in type module of the invention, the components integrated in the module 700 are themselves known and conventional, and can be selected and obtained from commercial sources or readily constructed by conventional techniques.

A self-contained fluid-cooled plug-in type module of the type shown in FIG. 7, when implemented in a typical package measuring about 6 in ×4 in ×1.2 in, can weigh about 1.2 lb and be capable of handling electronic and electro-optical devices requiring heat dissipation up to about 350 watts of power while providing adequate cooling of such devices.

Figure 8:
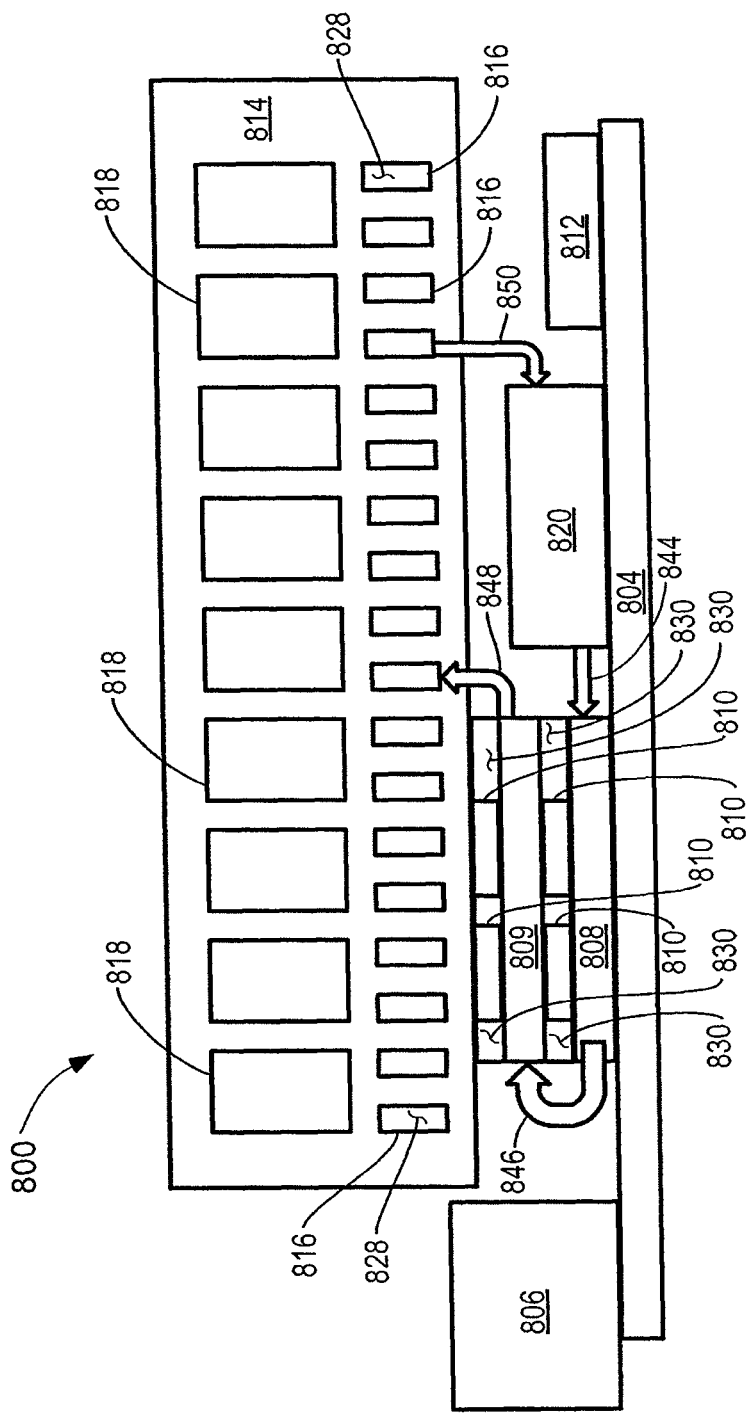
FIG. 8 shows a schematic side view of an eighth embodiment of the fluid-cooled module of the invention.

FIG. 8 illustrates another self-contained fluid-cooled plug-in type module 800 of the invention, wherein two levels of IC devices 810 and two interposers 808, 809 are stacked alternately between a PWB 804 and a heat exchanger 814.

The module 800 incorporates essentially the same arrangement of PWB 804, connector 806, interposers 808, 809, IC devices 810, pump 820, heat exchanger 814 with fluid channels 816 and cooling air ducts 818, as in the module 700 (FIG. 7), but employing an arrangement of cooling fluid flow similar to that of the module 600 (FIG. 6).

Thus, the module 800 contains at least two interposers 808 and 809, with IC devices 810 positioned between the interposers 808 and 809 for efficient heat transfer. The interposers 808 and 809 provide electrical and optical connections to the IC devices and are typically in thermal contact with the IC devices 810 to remove heat from them by conduction. The interposers 808 and 809 are provided with internal channels for conveying a heat transfer fluid 828 through the interposers. The internal fluid conduits of interposers 808 and 809 are connected to external fluid conduits 844, 846, and 848, which convey the heat transfer fluid 828, respectively, from pump 820 to interposer 808, between the interposers 808 and 809, and thence to heat exchanger 814. A fluid conduit 850 conveys the heat transfer fluid 828 from the heat exchanger 814 back to the pump 820.

In the module 800 the pump 820 may be mounted on the printed wiring board 804, and may receive electrical power and control signals through the circuitry of the printed wiring board 804 It will be understood that the conduits 844, 846, and 848 and 850 are shown schematically, to illustrate the circulation of the heat transfer fluid 828; they may be separate conduits, as shown, or may be integrated, as appropriate, into the printed wiring board 804.

In the module 800, heat exchanger 814 may also have internal ducts 818 for channeling cooling streams of air, provided from external equipment, through the mounting chassis for ultimate delivery of the removed heat to the environment.

The printed wiring board 804 may also serve as a support for other electronic or optical devices that do not require the intensive cooling provided by the circulation of heat transfer fluid 828. Such a device 812 is shown schematically, and may be mounted on the printed wiring board 804 by conventional methods, such as, e.g., a ball grid array.

Those elements of the module 800 that may benefit from special protection from the environment can be positioned within a protective volume 830, e.g., by encapsulation or other conventional protective enclosing structures, which may be integrated with the interposers 808 and 809 as shown.

As in the other embodiments of the self-contained fluid-cooled plug-in type module of the invention, the components integrated in the module 800 are themselves known and conventional, and can be selected and obtained from commercial sources or readily constructed by conventional techniques.

A self-contained fluid-cooled plug-in type module of the type shown in FIG. 8, when implemented in a typical package measuring about 6 in ×4 in ×1.2 in, can weigh about 1.2 lb and be capable of handling electronic and electro-optical devices requiring heat dissipation up to about 340 watts of power while providing adequate cooling of such devices.

The embodiments of the invention illustrated in FIGS. 7 and 8 are shown as including stacked assemblies of interposers and integrated circuit devices mounted on the interposers, wherein a stack assembly includes two such assemblies of interposer and ICs. However, the skilled practitioner will recognize that more than two such assemblies, e.g., three, four, or more, can be arranged in a stack, and provided with appropriate electrical connections and channels for cooling fluid. In such a stack, the heat exchanger is mounted in heat-transmissive contact with the integrated circuit or circuits that are most distant from the printed wiring board, i.e., in heat-transmissive contact with the outermost integrated circuit device.

Figure 9:
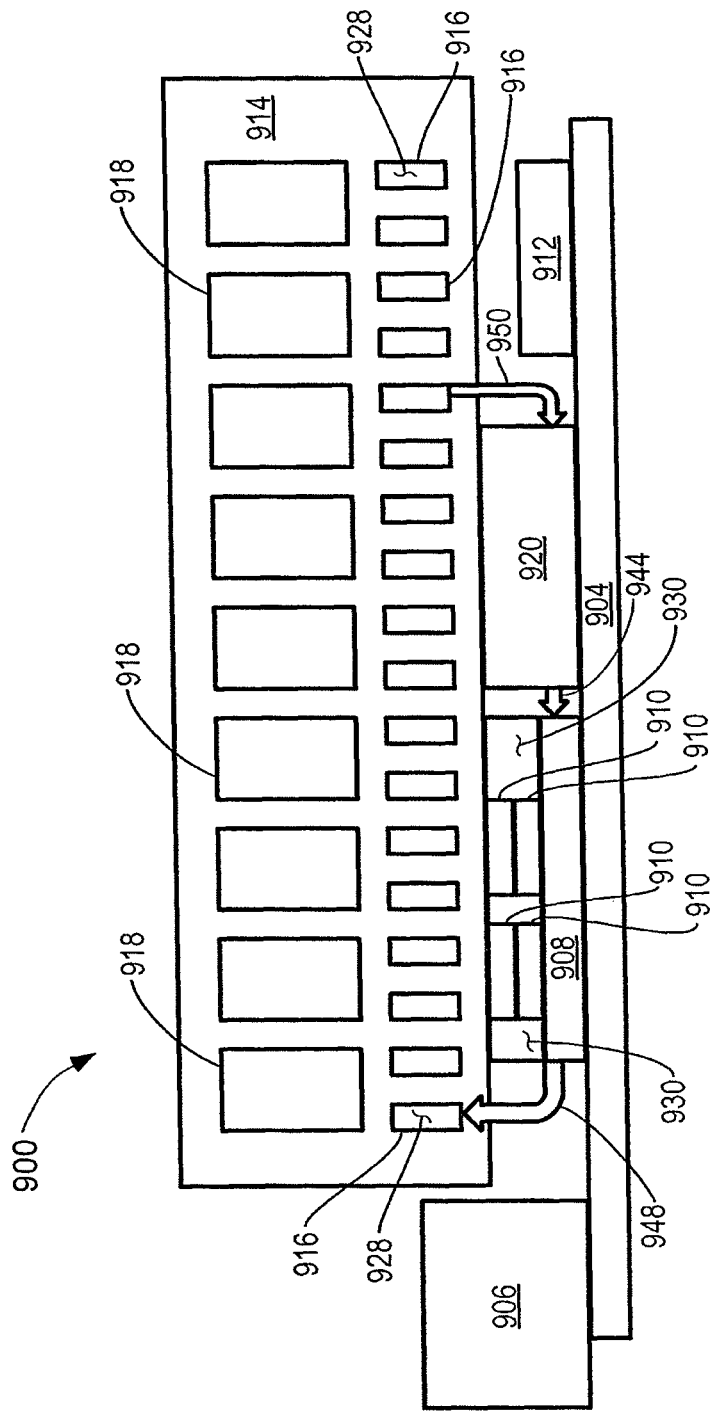
FIG. 9 shows a schematic side view of a ninth embodiment of the fluid-cooled module of the invention.

FIG. 9 illustrates another self-contained fluid-cooled plug-in type module 900 of the invention, using stacked IC devices 910 in thermal contact with an interposer 908 and a heat exchanger 914.

The module 900 has a PWB 904 upon which the other elements of the module 900 are mounted. As in the other embodiments of the modules of the invention, the PWB 904 may provide electrical and photonic connections between the devices mounted thereon and is provided with an electro-optical connector 906 that interfaces with appropriate connections in an external mounting chassis. In the module 900 the IC chips 910 are stacked and positioned between an interposer 908 and a heat exchanger 914. The interposer 908 provides electrical and optical connections to the IC devices 910, and is typically in thermal contact with the devices 910 to remove heat from them by conduction. In this embodiment some heat can be transferred directly by conduction from some of the IC devices 910 to the heat exchanger 914.

The interposer 908 has internal fluid conduits connected to external fluid conduits 944 and 948, which, respectively, convey the heat transfer fluid 928 from a pump 920 to the interposer 908, and from the interposer 908 to the channels 916 of heat exchanger 914. A fluid conduit 950 conveys the heat transfer fluid 928 from the heat exchanger 914 back to the pump 920.

In the module 900 the pump 920 may be mounted on the printed wiring board 904, and may receive electrical power and control signals through the circuitry of the printed wiring board 904. It will be understood that the conduits 944, 948, and 950 are shown schematically, to illustrate the circulation of the heat transfer fluid 828; they may be separate conduits, as shown, or may be integrated, at least in part, into the printed wiring board 904.

In the module 900, heat exchanger 914 may also have internal ducts 918 for channeling cooling streams of air, provided from external equipment, through the mounting chassis for ultimate delivery of the removed heat to the environment.

The printed wiring board 904 may also serve as a support for other electronic or optical devices that do not require the intensive cooling provided by the circulation of heat transfer fluid 928. Such a device 912 is shown schematically, and may be mounted on the printed wiring board 904 by conventional methods, such as, e.g., a ball grid array.

Those elements of the module 900 that may benefit from special protection from the environment can be positioned within a protective volume 930, e.g., by encapsulation or other conventional protective enclosing structures, which may be integrated with the interposer 908 and heat exchanger 914, as shown.

As in the other embodiments of the self-contained fluid-cooled plug-in type module of the invention, the components integrated in the module are themselves known and conventional, and can be selected and obtained from commercial sources or readily constructed by conventional techniques.

A self-contained fluid-cooled plug-in type module of the type shown in FIG. 9, when implemented in a typical package measuring about 6 in ×4 in ×1.2 in, can weigh about 1.2 lb and be capable of handling electronic and electro-optical devices requiring heat dissipation up to about 340 watts of power while providing adequate cooling of such devices.

FIGS. 7 through 9 illustrate modules having fluid-to-air heat exchangers similar to those shown in FIGS. 1 and 2. However, conduction cooled variations of the modules of FIGS. 7 through 9 can also be envisioned, having conduction cooling arrangements similar to those illustrated in FIGS. 5 and 6. As previously indicated, the conductive cooled variants enable higher power dissipations, on the order of 500 watts.

As noted previously, in certain embodiments of the fluid-cooled module of the invention, the heat exchanger may be incorporated within a lid or cover of one of the components of the module (e.g., a cover for a BGA hybrid) instead of being supported on the PWB substrate of the module.

Such an arrangement of the fluid-cooling elements of a fluid-cooled module of the invention is illustrated in FIG. 10. Thus, FIG. 10 shows the fluid-cooling arrangement 951 of a fluid-cooled module of the invention which includes a surface mount technology (SMT) interposer 958, supporting an assembly of IC chips 960, with a heat exchanger lid 964 positioned on top of, and in contact with, at least some of the chips 960. A surface mount technology (SMT) pump 970 circulates a cooling liquid through the interposer 958 and heat exchanger lid 964 via conduits 994, 960, and 999. It will be understood that the circulation of the cooling fluid is indicated schematically by the pump 970 and conduits 994, 960, and 999, which may be individual conduits or may be integrated into supporting elements (not shown) of the module. The chips 960 may be encapsulated within a conventional protective volume 980. The module 951 may incorporate electric and/or optical conductors and connectors, not shown, for interfacing with corresponding components in its mounting chassis, or the like. Such a module 951 may have dimensions of about 3 in ×2 in ×1 in, having a weight of about 0.75 lb; and may be capable of dissipating about 340 watts.

The invention having been explained in detail, it will be evident to the skilled practitioner that various changes and modifications can be made without departing from the substance and spirit of the invention, and that all such variations and modifications are considered as included in the invention.

We claim:

1. A closed-loop fluid-cooled electronic module, comprising:
   a printed wiring board incorporating printed wiring board electric circuitry;
   an interposer mounted on said printed wiring board, said interposer having at least one interposer cooling fluid channel for circulating a cooling fluid therethrough and being provided with electrical wiring in electrical communication with said printed wiring board electric circuitry;
   an electronic or electro-optical device in heat-transmissive contact with said interposer and in electrical communication with said electrical wiring of said interposer;
   a heat exchanger mounted on said printed wiring board, said heat exchanger having at least one heat exchanger cooling fluid channel for circulating said cooling fluid therethrough; and
   a pump mounted on said interposer, for circulating said cooling fluid through said at least one interposer cooling fluid channel and said at least one heat exchanger cooling fluid channel;
   wherein said heat exchanger, and said pump being configured to circulate said cooling fluid through said at least one interposer cooling fluid channel and said at least one cooling fluid heat exchanger channel in a closed-loop fluid cooling path.

2. The module of claim 1, wherein said printed wiring board is provided with an electrical connector designed and configured to connect with electrical circuitry in an external mounting chassis for said module.

3. The module of claim 1, wherein said electronic or electro-optical device is an electro-optical device and said interposer has at least one interposer optical signal channel in optical communication with said electro-optical device.

4. The module of claim 3, wherein said printed wiring board has at least one printed wiring board optical signal channel in optical communication with said optical interposer signal channel.

5. The module of claim 4, wherein said printed wiring board is provided with an electro-optical connector designed and configured to connect with electrical circuitry in an external mounting chassis and at least one external optical signal channel in the external mounting chassis for said module.

6. The module of claim 1, wherein said electronic or electro-optical device has at least one internal fluid cooling channel in fluid transmissive communication with said at least one interposer cooling fluid channel.

7. The module of claim 1, wherein said heat exchanger has a surface designed and configured to contact an external heat sink in a mounting chassis for transfer of heat from said heat exchanger surface to said heat sink.

8. The module of claim 1, wherein said heat exchanger additionally has ducts or fins for heat transfer to a gaseous cooling medium.

9. The module of claim 1, wherein the cooling fluid includes a gas.

10. The module of claim 1, wherein the cooling fluid includes a combination of liquid and gas.

11. The module of claim 1, wherein the heat exchanger is mounted directly on the printed wiring board.

12. A fluid-cooled electronic or electro-optical module, comprising:
   an interposer having at least electrical circuitry and having at least one cooling fluid channel;

a micro-electronic or electro-optical device mounted on said interposer in heat transmissive contact therewith;
a pump mounted on said interposer;
a heat exchanger; and
a closed-loop fluid cooling path providing fluid communication exclusively between the pump, the heat exchanger and the interposer.

13. The fluid-cooled electronic or electro-optical module of claim 12, wherein said heat exchanger forms a cover for said module.

14. The fluid-cooled electronic or electro-optical module of claim 12, additionally comprising;
a printed circuit board having at least electrical circuitry, wherein at least one of said interposer and said micro-electronic or electro-optical device is in electrical communication with said electrical circuitry of said printed circuit board.

15. The fluid-cooled electronic or electro-optical module of claim 14, wherein: said interposer includes an interposer optical signal channel; and said printed circuit board additionally comprises a printed circuit board optical signal channel, in optical communication with said interposer optical signal channel; wherein said micro-electronic or electro-optical device is in optical communication with said interposer optical signal channel.

16. A method for cooling an integrated circuit device, comprising:
providing a module comprising:
an interposer having a cooling fluid channel;
a pump mounted on said interposer;
a heat exchanger; and
a closed-loop fluid cooling path providing fluid communication to the pump, the heat exchanger, and the interposer;
providing an integrated circuit device mounted on said interposer in heat transmissive contact therewith, the integrated circuit device including at least one internal cooling fluid channel in fluid communication with said cooling fluid channel in said interposer; and
circulating a cooling fluid through said closed-loop fluid cooling path circulated at a rate sufficient to provide a heat dissipation of at least 300 watts.

17. A closed-loop fluid-cooled electronic module, comprising:
a printed wiring board incorporating printed wiring board electric circuitry;
a first interposer mounted on said printed wiring board, said first interposer having at least one interposer cooling fluid channel for circulating a cooling fluid therethrough and being provided with electrical wiring in electrical communication with said printed wiring board electric circuitry;
an electronic or electro-optical device in heat-transmissive contact with said first interposer and in electrical communication with said electrical wiring of said first interposer;
a heat exchanger mounted on said printed wiring board, said heat exchanger having at least one heat exchanger cooling fluid channel for circulating said cooling fluid therethrough;
a second interposer, in heat transmissive contact with said electronic or electro-optical device, wherein said heat exchanger is supported, at least in part, on said second interposer; and
a pump mounted on said printed wiring board or said first interposer, for circulating said cooling fluid through said at least one interposer cooling fluid channel and said at least one heat exchanger cooling fluid channel;
wherein said heat exchanger, and said pump being configured to circulate said cooling fluid through said at least one interposer cooling fluid channel and said at least one cooling fluid heat exchanger channel in a closed-loop fluid cooling path.

18. The module of claim 17, wherein said electronic or electro-optical device is one of a plurality of said electronic or electro-optical devices in a superimposed configuration that are positioned between said first interposer and said second interposer and in heat transmissive contact with said first and second interposers.

19. The module of claim 17, wherein: said electronic or electro-optical device is a first electronic or electro-optical device; at least a second electronic or electro-optical device is mounted on said second interposer in heat transmissive contact therewith.

20. The fluid-cooled electronic module of claim 17, wherein: said electronic or electro-optical device is one of at least two electronic or electro-optical devices in a superimposed configuration that are positioned between said interposer and said heat exchanger in heat transmissive contact with both said interposer and said heat exchanger.

* * * * *